(12) United States Patent
 Lee

(10) Patent No.: US 11,721,484 B2
(45) Date of Patent: Aug. 8, 2023

(54) MULTILAYER CERAMIC CAPACITOR AND SUBSTRATE INCLUDING THE SAME

(71) Applicant: SAMSUNG ELECTRO-MECHANICS CO., LTD., Suwon-si (KR)

(72) Inventor: Sun Cheol Lee, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 17/465,182

(22) Filed: Sep. 2, 2021

(65) Prior Publication Data

US 2021/0398749 A1 Dec. 23, 2021

Related U.S. Application Data

(63) Continuation of application No. 16/673,159, filed on Nov. 4, 2019, now Pat. No. 11,170,938.

(30) Foreign Application Priority Data

Aug. 8, 2019 (KR) .......................... 10-2019-0096692

(51) Int. Cl.
 *H01G 4/232* (2006.01)
 *H01G 4/01* (2006.01)
 (Continued)

(52) U.S. Cl.
 CPC ............. *H01G 4/232* (2013.01); *H01G 2/065* (2013.01); *H01G 4/01* (2013.01); *H01G 4/12* (2013.01);
 (Continued)

(58) Field of Classification Search
 CPC .......... H01G 4/232; H01G 2/065; H01G 4/01; H01G 4/12; H01G 4/224; H01G 4/30; H05K 1/181; H05K 2201/10636
 See application file for complete search history.

(56) References Cited

U.S. PATENT DOCUMENTS 9,824,822 B2 * 11/2017 Adachi ................ H01G 4/1227
10,102,976 B2   10/2018 Wu et al.
(Continued)

FOREIGN PATENT DOCUMENTS

CN   206471231 U   9/2017
CN   109565941 A   4/2019
(Continued)

OTHER PUBLICATIONS

Chinese Office Action dated Oct. 8, 2021 issued in Chinese Patent Application No. 202010078947.X (with English translation).
(Continued)

*Primary Examiner* — Michael P McFadden
(74) *Attorney, Agent, or Firm* — Morgan, Lewis & Bockius LLP

(57) ABSTRACT

A multilayer ceramic capacitor includes a body including a dielectric layer, and first and second internal electrodes configured to be layered in a third direction with the dielectric layer interposed therebetween and having first and second connection portions, respectively, and including first, second, third, fourth, fifth and sixth surfaces; a first external electrode disposed on the fifth surface of the body; and a second external electrode disposed on the fifth surface of the body. The first internal electrode is exposed to the third surface and the fifth surface of the body through the first connection portion, and the second internal electrode is exposed to the fourth surface and the fifth surface of the body through the second connection portion.

7 Claims, 5 Drawing Sheets

(51) Int. Cl.
  *H01G 4/12*     (2006.01)
  *H01G 2/06*     (2006.01)
  *H01G 4/224*    (2006.01)
  *H05K 1/18*     (2006.01)
  *H01G 4/30*     (2006.01)
(52) U.S. Cl.
  CPC .............. *H01G 4/224* (2013.01); *H01G 4/30* (2013.01); *H05K 1/181* (2013.01); *H05K 2201/10636* (2013.01)

(56) References Cited

U.S. PATENT DOCUMENTS

| | | | |
|---|---|---|---|
| 11,051,398 B2 | 6/2021 | Matsushita et al. | |
| 2009/0086406 A1* | 4/2009 | Lee | H01G 4/228 361/306.3 |
| 2010/0103586 A1* | 4/2010 | Tang | H01G 4/232 361/301.4 |
| 2012/0127626 A1 | 5/2012 | Chang | |
| 2013/0120899 A1* | 5/2013 | Chung | H01G 4/002 156/89.12 |
| 2016/0260547 A1 | 9/2016 | Park | |
| 2017/0169954 A1* | 6/2017 | Ota | H01G 4/232 |
| 2017/0287641 A1 | 10/2017 | Wu | |
| 2018/0351526 A1 | 12/2018 | Miyoshi | |
| 2019/0027312 A1* | 1/2019 | Muramatsu | H01G 4/12 |
| 2019/0066921 A1 | 2/2019 | Cho | |
| 2019/0208622 A1* | 7/2019 | Matsushita | H01G 4/012 |
| 2019/0355518 A1* | 11/2019 | Harada | H01G 4/30 |

FOREIGN PATENT DOCUMENTS

| | | |
|---|---|---|
| JP | 2010-129657 A | 6/2010 |
| JP | 2019-024077 A | 2/2019 |
| KR | 10-2019-0023594 A | 3/2019 |

OTHER PUBLICATIONS

U.S. Final Office Action dated Jul. 28, 2021 issued in U.S. Appl. No. 16/673,159.

U.S. Office Action dated Feb. 19, 2021 issued in U.S. Appl. No. 16/673,159.

* cited by examiner

MULTILAYER CERAMIC CAPACITOR AND SUBSTRATE INCLUDING THE SAME

CROSS-REFERENCE TO RELATED APPLICATION(S)

This application is continuation of U.S. patent application Ser. No. 16/673,159, filed on Nov. 4, 2019, which claims benefit of priority to Korean Patent Application No. 10-2019-0096692 filed on Aug. 8, 2019, the disclosures of which are incorporated herein by reference in their entireties.

TECHNICAL FIELD

The present disclosure relates to a multilayer ceramic capacitor and a substrate including the same.

BACKGROUND

A multilayer ceramic capacitor (MLCC), a capacitor component, has a small size and high capacitance, and may be easily mounted.

Recently, a ceramic electronic component, particularly, a multilayer ceramic capacitor, has been designed to have high capacitance in accordance with market demand. To secure capacitance, it may be necessary to increase the number of layers, but when the number of layers increases, reliability of a chip may degrade.

The issue described above may be caused by an increase of a step portion formed due to a thickness of an internal electrode when the number of layers increases. As the number of layers increases, a dielectric layer may be elongated to fill the step portion, which may cause delamination between cover layers, cracks during a plasticizing process, or other issues.

Thus, it has been required to develop a multilayer ceramic capacitor which may have a reduced size and high capacitance, along with improved mechanical reliability and improved moisture resistance reliability.

SUMMARY

An aspect of the present disclosure is to provide a multilayer ceramic capacitor which may have improved mechanical strength.

Another aspect of the present disclosure is to provide a multilayer ceramic capacitor which may have improved moisture resistance reliability.

Another aspect of the present disclosure is to provide a multilayer ceramic capacitor which may prevent an ESR defect by improving adhesive properties between an internal electrode and an external electrode.

Another aspect of the present disclosure is to provide a multilayer ceramic capacitor which may secure high capacitance while preventing cracks or delamination.

According to an aspect of the present disclosure, a multilayer ceramic capacitor is provided, the multilayer ceramic capacitor including a body including a dielectric layer, and first and second internal electrodes layered in a third direction with the dielectric layer interposed therebetween and having first and second connection portions, respectively, and including first and second surfaces opposing each other in the third direction, third and fourth surfaces opposing each other in a first direction, and fifth and sixth surfaces opposing each other in a second direction; a first external electrode connected to the first internal electrode and disposed on the fifth surface of the body; and a second external electrode connected to the second internal electrode, spaced apart from the first external electrode, and disposed on the fifth surface of the body. The first internal electrode is exposed from the third surface and the fifth surface of the body through the first connection portion, and the second internal electrode is exposed from the fourth surface and the fifth surface of the body through the second connection portion.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
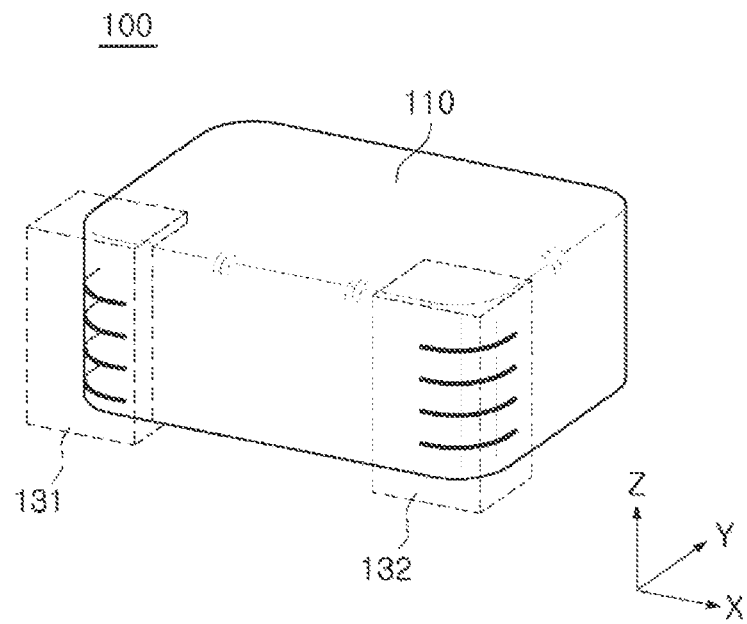
FIG. 1 is a perspective diagram illustrating a multilayer ceramic capacitor according to an example embodiment of the present disclosure.

Hereinafter, embodiments of the present disclosure will be described as follows with reference to the attached drawings.

These embodiments are described in sufficient detail to enable those skilled in the art to practice the invention. It is to be understood that the various embodiments of the invention, although different, are not necessarily mutually exclusive. For example, structures, shapes, and sizes described as examples in embodiments in the present disclosure may be implemented in another example embodiment without departing from the spirit and scope of the present disclosure. Shapes and sizes of elements in the drawings may be exaggerated for clarity of description, and the same elements will be indicated by the same reference numerals.

For clarity of description, some elements may be omitted or briefly illustrated, and thicknesses of elements may be magnified to clearly represent layers and regions. It will be understood that when a portion "includes" an element, it can further include another element, not excluding another element, unless otherwise indicated.

In the diagram, an X direction may be defined as a first direction, an L direction, or a length direction, a Y direction may be defined as a second direction, a W direction, or a width direction, and a Z direction may be defined as a third direction, a T direction, or a thickness direction.

Figure 2:
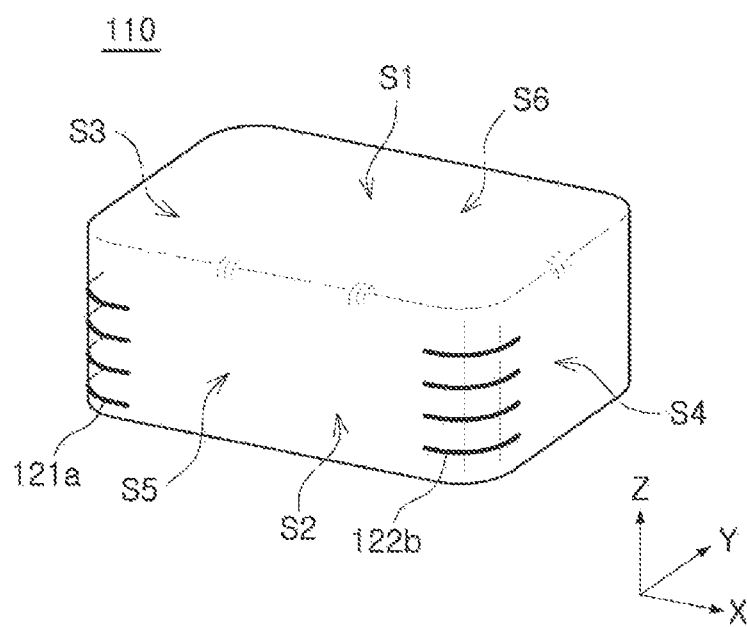
FIG. 2 is a perspective diagram illustrating a body illustrated in FIG. 1.
Figure 3:
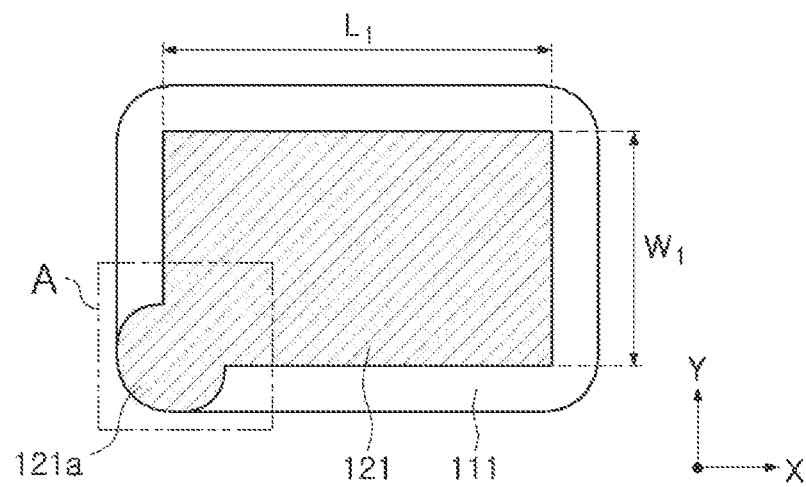
FIGS. 3 and 4 are plan diagrams illustrating an internal electrode according to an example embodiment of the present disclosure.
Figure 4:
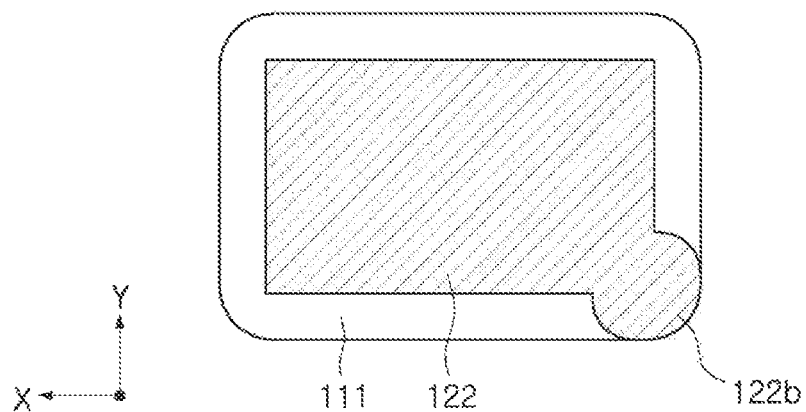
Figure 5:
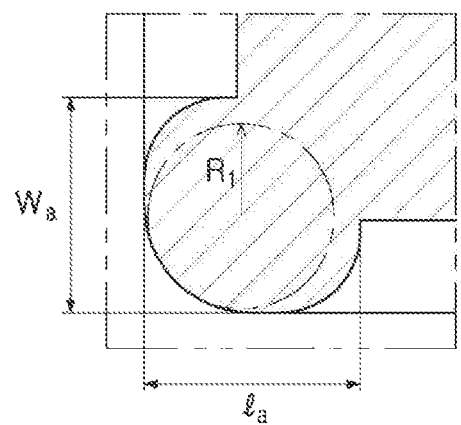
FIG. 5 is an enlarged diagram illustrating region A illustrated in FIG. 3.

FIG. 1 is a perspective diagram illustrating a multilayer ceramic capacitor according to an example embodiment of the present disclosure. FIG. 2 is a perspective diagram illustrating a body illustrated in FIG. 1. FIGS. 3 and 4 are plan diagrams illustrating an internal electrode according to an example embodiment of the present disclosure. FIG. 5 is an enlarged diagram illustrating region A illustrated in FIG. 3. In the description below, an example embodiment of a multilayer ceramic capacitor will be described in greater detail with reference to FIGS. 1 to 5.

A multilayer ceramic capacitor 100 in the example embodiment may include a body 110 including a dielectric layer 111, and first and second internal electrodes 121 and 122 configured to be layered in a third direction (a Z direction) with the dielectric layer 111 interposed therebetween and having first and second connection portions 121a and 122b, respectively, and having first and second surfaces S1 and S2 opposing each other in the third direction (a Z direction), third and fourth surfaces S3 and S4 opposing each other in a first direction (an X direction), and fifth and sixth surfaces S5 and S6 opposing each other in a second direction (a Y direction), a first external electrode 131 electrically connected to the first internal electrode 121 and disposed on the fifth surface S5 of the body 110, and a second external electrode 132 electrically connected to the second internal electrode 122, spaced apart from the first external electrode 131, and disposed on the fifth surface S5 of the body 110.

The first internal electrode 121 may be exposed to the third surface S3 and the fifth surface S5 of the body 110 through the first connection portion 121a, and the second internal electrode 122 may be exposed to the fourth surface S4 and the fifth surface S5 of the body 110 through the second connection portion 122b.

A shape of the body 110 may not be limited to any particular shape, and the body 110 may have a hexahedral shape or a shape similar to a hexahedron, for example. Due to contraction of ceramic powder included in the body 110 during a sintering process, the body 110 may not have an exact hexahedral shape with straight lines, but may have a substantially hexahedral shape.

The body 110 may have the first and second surfaces S1 and S2 opposing each other in a thickness direction (a Z direction), the third and fourth surfaces S3 and S4 connected to the first and second surfaces S1 and S2 and opposing each other in a length direction (an X direction), and the fifth and sixth surfaces S5 and S6 connected to the first and second surfaces S1 and S2 and the third and fourth surfaces S3 and S4 and opposing each other in a width direction (a W direction). A surface selected from among the first, second, third, fourth, and fifth surfaces S1, S2, S3, S4, and S5 may be configured as a mounting surface. For example, in the example embodiment, the fifth surface S5 may be configured as a mounting surface.

A length of the body 110 taken in the first direction may be configured to be longer than a width taken in the second direction. The length taken in the first direction may refer to a shortest vertical distance between the third surface S3 and the fourth surface S4 opposing each other in the X direction, and a width taken in the second direction may refer to a shortest vertical distance between the fifth surface S5 and the sixth surface S6 opposing each other in the Y direction.

A plurality of the dielectric layers 111 included in the body 110 may be in a sintered state, and the dielectric layers may be integrated such that it may be difficult to identify a boundary between adjacent dielectric layers without using a scanning electron microscope (SEM).

In the example embodiment, a material of the dielectric layer 111 may not be limited to any particular material as long as sufficient capacitance can be obtained therewith. For example, the dielectric layer 111 may be formed using a barium titanate material, a Perovskite material compound with lead (Pb), a strontium titanate material, or the like. The barium titanate material may include a $BaTiO_3$ based ceramic powder, and an example of the ceramic powder may include $(Ba_{1-x}Ca_x)TiO_3$, $Ba(Ti_{1-y}Ca_y)O_3$, $(Ba_{1-x}Ca_x)(Ti_{1-y}Zr_y)O_3$, $Ba(Ti_{1-y}Zr_y)O_3$, or the like, in which calcium (Ca), zirconium (Zr), and the like, are partially solidified. As the material of the dielectric layer 111, a barium titanate (BaTiO3) powder, or the like, including various ceramic additives, organic solvents, coupling agents, dispersing agents, and the like, may be used, depending on an intended purpose.

As the ceramic additives, a transition metal oxide or a transition metal carbide, a rare earth element, magnesium (Mg), aluminum (Al), or the like, may be used.

A cover portion having a certain thickness may be disposed on a lower portion of a lowermost internal electrode and an upper portion of an uppermost internal electrode. The cover portion may include a material the same as a material of the dielectric layer 111, and may be formed by layering one or more dielectric layers included in the cover portion on the upper portion of an uppermost internal electrode and the lower portion of a lowermost internal electrode.

In the example embodiment, a ratio ($\ell_a/L_1$) of a length $\ell_a$ of the first connection portion 121a or the second connection portion 122b to a length $L_1$ of the first internal electrode 121 or the second internal electrode 122 may be within a range of 0.1 to 0.4. FIGS. 3 to 5 are plan diagrams illustrating an internal electrode according to an example embodiment. Referring to FIGS. 3 to 5, a length of the first internal electrode 121 and/or the second internal electrode 122 may be denoted "$L_1$", and a length of the first connection portion 121a and/or the second connection portion 122b may be denoted "$\ell_a$". In this case, the ratio ($\ell_a/L_1$) of the length ($\ell_a$) of the first connection portion 121a or the second connection portion 122b to the length ($L_1$) of the first internal electrode 121 or the second internal electrode 122 may satisfy a range of 0.1 to 0.4. As the ratio ($\ell_a/L_1$) satisfies the above-described range, the multilayer ceramic capacitor may have improved mechanical strength, and connectivity between the internal electrode and the external electrode may improve.

In another example embodiment, a ratio ($W_a/W_1$) of a width ($W_a$) of the first connection portion 121a or the second connection portion 122b to a width ($W_1$) of the first internal electrode 121 or the second internal electrode 122 may be within a range of 0.1 to 0.4. Referring to FIGS. 3 to 5, a width of the first internal electrode 121 and/or the second internal electrode 122 may be denoted as $W_1$, and a width of the first connection portion 121a and/or the second connection portion 122b may be denoted as $W_a$. In this case, the ratio ($W_a/W_1$) of the width ($W_a$) of the first connection portion 121a or the second connection portion 122b to the width ($W_1$) of the first internal electrode 121 or the second internal electrode 122 may satisfy a range of 0.1 to 0.4. As the ratio ($W_a/W_1$) satisfies the above-described range, the multilayer ceramic capacitor may have improved moisture resistance reliability, and adhesive properties between the internal electrode and the external electrode may improve.

In the example embodiment, a center of each of the first internal electrode 121 and the second internal electrode 122 may be disposed on a center of the dielectric layer 111. A center of the first internal electrode 121 and/or the second internal electrode 122 may refer to a point at which a central line of each of the internal electrodes taken in the X direction meets a central line taken in the Y direction, a point including an error range (0 to 50 μm), under the assumption that the first connection portion 121a and the second connection portion 122b are not disposed in the internal electrodes. The central line of the internal electrode taken in the X direction may be a line connecting points at which distances to both ends of the internal electrode taken in the X direction are the same. Also, the central line taken in the Y direction may be a line connecting points at which distances to both ends of the internal electrode taken in the Y direction are the same.

In the example embodiment, a center of the dielectric layer 111 may refer to a point at which a central line of the dielectric layer 111 taken in the X direction meets a central line taken in the Y direction. The central line of the dielectric layer 111 taken in the X direction may be a line connecting points at which distances to both ends of the dielectric layer 111 taken in the X direction are the same, and the central line taken in the Y direction may be a line connecting points at which distances to both ends of the dielectric layer 111 taken in the Y direction are the same. Alternatively, the central line of the dielectric layer 111 taken in the X direction may refer to a line connecting points at which a vertical distance to the third surface S3 of the body 110 is the same as a vertical distance to the fourth surface S4, and the central line taken in the Y direction may refer to a line connecting points at which a vertical distance to the fifth surface S5 of the body 110 is the same as a vertical distance to the sixth surface S6. In the example embodiment, by disposing a center of each of the first internal electrode 121 and the second internal electrode 122 on the center of the dielectric layer 111, a contact area between the dielectric layers 111 may increase, and mechanical strength of the multilayer ceramic capacitor may improve.

In an example embodiment, a surface of each of the first and second connection portions 121a and 122b exposed from the body 110 may have a rounded shape. Referring to FIGS. 3 to 5, with reference to the third direction (a Z direction), a shape of an external side of each of the first and second connection portions 121a and 122b, not in contact with the internal electrode, may have a rounded shape, and a shape of a region which is not in contact with the internal electrode on an X-Y plane may have a rounded shape.

A radius of curvature of the surface of each of the first and second connection portions 121a and 122b exposed from the body 110 may not be limited to any particular size. For example, the radius of curvature may be within a range of 0.1 to 1 times the width $W_a$ of the first connection portion 121a or the second connection portion 122b. FIG. 5 is an enlarged diagram illustrating the first connection portion 121a. Referring to FIG. 5, a radius of curvature $R_1$ of the first connection portion 121a may be within a range of $0.1 \times W_a$ to $1.0 \times W_a$. The "$W_a$" may indicate a width $W_a$ of the first connection portion 121a. The radius of curvature $R_1$ is described with reference to the first connection portion 121a, but the example embodiment may also be applied to the second connection portion 122b. As the first and second connection portions 121a and 122b in the example embodiment are exposed in rounded shape as described above, or the first and second connection portions 121a and 122b satisfy the above-mentioned radius of curvature, a contact area between the internal electrode and the external electrode may increase such that cohesion force between the internal electrode and the external electrode may increase.

A method of configuring the portion of each of the first and second connection portions 121a and 122b of the multilayer ceramic capacitor 100 exposed from the body to have a rounded shape and to have the above-described radius of curvature is not limited to any particular method. For example, the body may be configured to have a rounded shape by cutting out corners of the body using a laser cutter, or the like, or by grinding corners of the body using a grinder, a grinding barrel, or the like, but the method is not limited thereto.

A material of the first and second internal electrodes 121 and 122 and the first and second connection portions 121a and 122b is not limited to any particular material. For example, the first and second internal electrodes 121 and 122 and the first and second connection portions 121a and 122b may be formed of a conductive paste including one or more materials from among silver (Ag), palladium (Pd), gold (Au), platinum (Pt), nickel (Ni), tin (Sn), copper (Cu), tungsten (W), titanium (Ti), and alloys thereof. As a method of printing the conductive paste, a screen-printing method, a gravure printing method, or the like, may be used, but the printing method is not limited thereto.

In the example embodiment, the first and second external electrodes 131 and 132 may be disposed adjacent to the first and second internal electrodes 121 and 122, respectively. The first and second external electrodes 131 and 132 may be spaced apart from each other, and may be disposed on the fifth surface S5 of the body 110. The configuration in which the first and second external electrodes 131 and 132 may be disposed adjacent to the first and second internal electrodes 121 and 122, respectively, may indicate that the first internal electrode 121 may be electrically connected to the first external electrode 131 through a portion of the first connection portion 121a of the first internal electrode 121 exposed externally from the body 110, and may also indicate that the second internal electrode 122 may be electrically connected to the second external electrode 132 through a portion of the second connection portion 122b of the second internal electrode 122 exposed externally from the body 110. In the multilayer ceramic capacitor in the example embodiment, the fifth surface S5 may be configured as a mounting surface, for example.

In an example embodiment, the first external electrode 131 may extend to the third surface S3 of the body, and the second external electrode 132 may extend to the fourth surface S4 of the body. The configuration in which the first external electrode 131 may extend to the third surface S3 of the body may indicate that the first external electrode 131 may be disposed across a portion of the third surface S3 and a portion of the fifth surface S5 of the body 110. Also, the configuration in which the second external electrode 132 may extend to the fourth surface S4 of the body 110 may indicate that the second external electrode 132 may be disposed across a portion of the fourth surface S4 and a portion of the fifth surface S5 of the body 110. In the multilayer ceramic capacitor 100 in the example embodiment, as the external electrode is disposed on the side surfaces S3 and S4 of the mounting surface S5, a contact area with a solder may be expanded.

A method of forming the first and second external electrodes 131 and 132 is not limited to any particular method. For example, the first and second external electrodes 131 and 132 may be formed by dipping the body in a paste including a conductive metal and glass, or by transferring a dried film formed by drying a metal paste on the body.

In the example embodiment, the first and second external electrodes 131 and 132 may be formed using one or more of silver (Ag), palladium (Pd), gold (Au), platinum (Pt), nickel (Ni), copper (Cu), tin (Sn), tungsten (W), titanium (Ti), or alloys thereof. Also, to improve mounting properties with the substrate, a plating layer may be formed on the first and second external electrodes 131 and 132.

Figure 6:
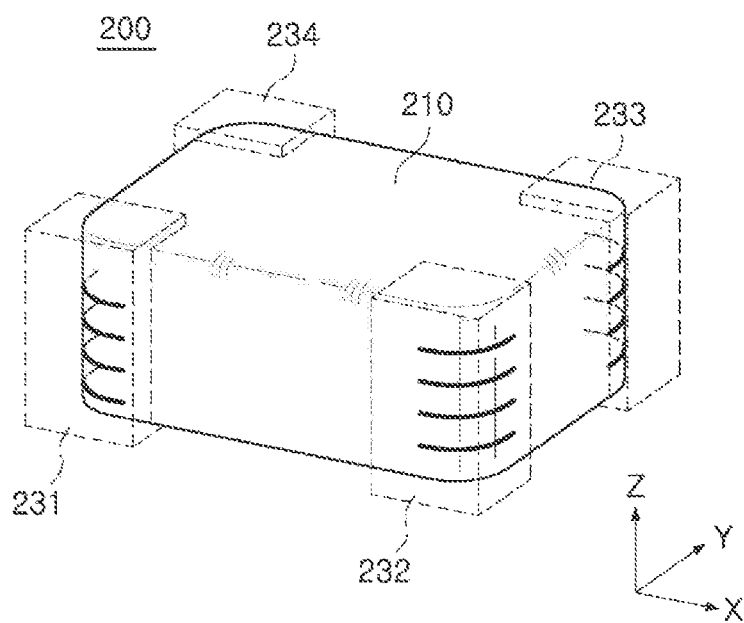
FIG. 6 is a perspective diagram illustrating a multilayer ceramic capacitor according to another example embodiment of the present disclosure.
Figure 7:
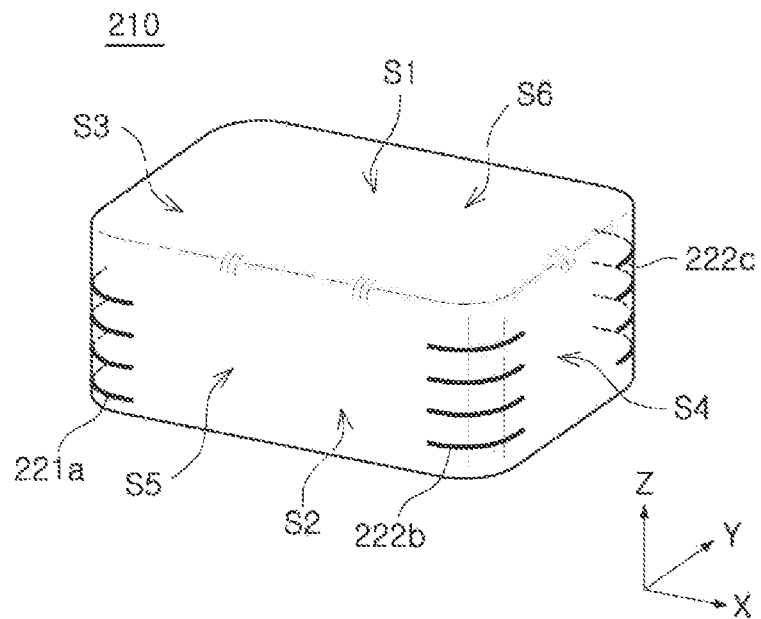
FIG. 7 is a perspective diagram illustrating a body illustrated in FIG. 6.
Figure 8:
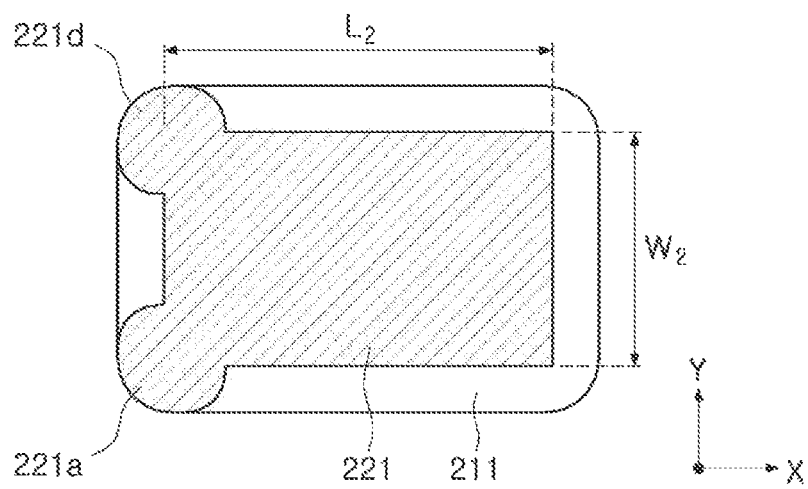
FIGS. 8 and 9 are plan diagrams illustrating an internal electrode according to an example embodiment of the present disclosure.
Figure 9:
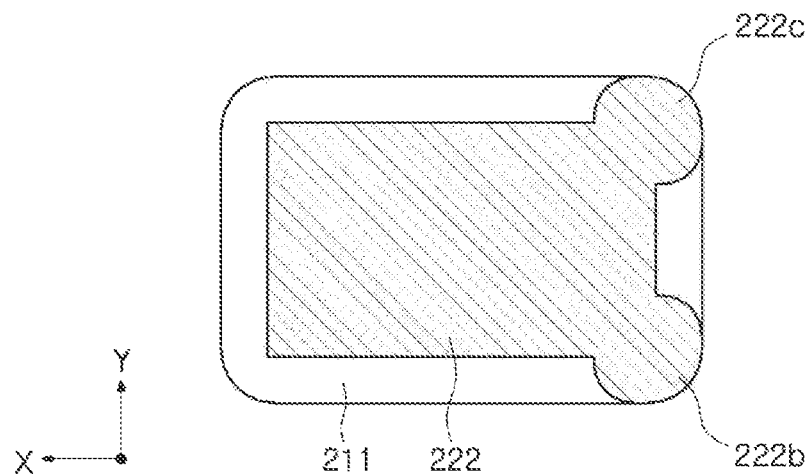

FIG. 6 is a perspective diagram illustrating a multilayer ceramic capacitor according to another example embodiment. FIG. 7 is a perspective diagram illustrating a body illustrated in FIG. 6. FIGS. 8 and 9 are plan diagrams illustrating first and second internal electrodes according to an example embodiment. Referring to FIGS. 6 to 9, in a multilayer ceramic capacitor 200 according to another example embodiment, a first internal electrode 221 may further include a fourth connection portion 221d, and a second internal electrode 222 may further include a third connection portion 222c. The first internal electrode 221 may include a first connection portion 221a and the fourth connection portion 221d, and the second internal electrode 222 may include a second connection portion 222b and the third connection portion 222c. When the first and second internal electrodes 221 and 222 further include an additional connection portion, the connection portion may be disposed on each of corners of a body 210 such that, when the multilayer ceramic capacitor in the example embodiment is mounted on a substrate, a mounting direction may not be limited to one particular direction, thereby improving productivity.

In the example embodiment, the first connection portion 221a and the fourth connection portion 221d of the first internal electrode 221 may be exposed to a third surface S3 and a fifth surface S5 and to the third surface S3 and a sixth surface S6 of the body 210, respectively. Also, the second internal electrode 222 and the third connection portion 222c of the second internal electrode 222 may be exposed to the fourth surface S4 and the fifth surface S5 and to the fourth surface S4 and the sixth surface S6 of the body 210, respectively. In the multilayer ceramic capacitor in the example embodiment, a contact area with an external electrode may be expanded, thereby preventing an ESR defect.

In another example embodiment, the multilayer ceramic capacitor 200 may further include a third external electrode 233 and a fourth external electrode 234, and the third external electrode 233 may be spaced apart from first and second external electrodes 231 and 232, and may be disposed across a portion of the fourth surface S4 and a portion of the sixth surface S6 of the body 210. The fourth external electrode 234 may be spaced apart from the first to third external electrodes 231, 232, and 233, and may be disposed across a portion of the third surface S3 and a portion of the sixth surface S6 of the body 210. Referring to FIGS. 6 to 9, in the multilayer ceramic capacitor 200, the first connection portion 221a of the first internal electrode 221 may be exposed to the third surface S3 and the fifth surface S5 of the body 210, and the first external electrode 231 may be electrically connected to the first internal electrode 221 through a portion of the first connection portion 221a exposed externally from the body 210. The fourth connection portion 221d of the first internal electrode 221 may be exposed to the third surface S3 and the sixth surface S6 of the body 210, and the fourth external electrode 234 may be electrically connected to the first internal electrode 221 through a portion of the fourth connection portion 221d exposed externally from the body 210.

The descriptions of the third connection portion, the fourth connection portion, the third external electrode, the fourth external electrode, and the like, may be the same as the descriptions of the first connection portion, the second connection portion, the first external portion, and the second external electrode, and thus, overlapping descriptions will not be provided.

A second connection portion 222b of the second internal electrode 222 may be exposed to the fourth surface S4 and the fifth surface S5 of the body 210, and the second external electrode 232 may be electrically connected to the second internal electrode 222 through a portion of the second connection portion 222b exposed externally from the body 210. The third connection portion 222c of the second internal electrode 222 may be exposed to the fourth surface S4 and the sixth surface S6 of the body 210, and the third external electrode 233 may be electrically connected to the second internal electrode 222 through a portion of the third connection portion 222c exposed externally from the body 210.

In the multilayer ceramic capacitor in the example embodiment, the first to fourth connection portions may be exposed through four corners of the body on an X-Y plane, and the first to fourth external electrodes may be connected to the first to fourth connection portions, respectively. By including the above-described structure, adhesive force and connectivity between the internal electrode and the external electrode may increase such that an ESR defect may be prevented, and mechanical properties of a chip may improve.

The above-described structure may not be affected by a mounting surface, and the fifth surface or the sixth surface of the body may be configured as a mounting surface. In the structure, it may not be necessary to distinguish an upper portion and a lower portion from each other, and accordingly, productivity may improve when the multilayer ceramic capacitor is mounted on a substrate.

Figure 10:
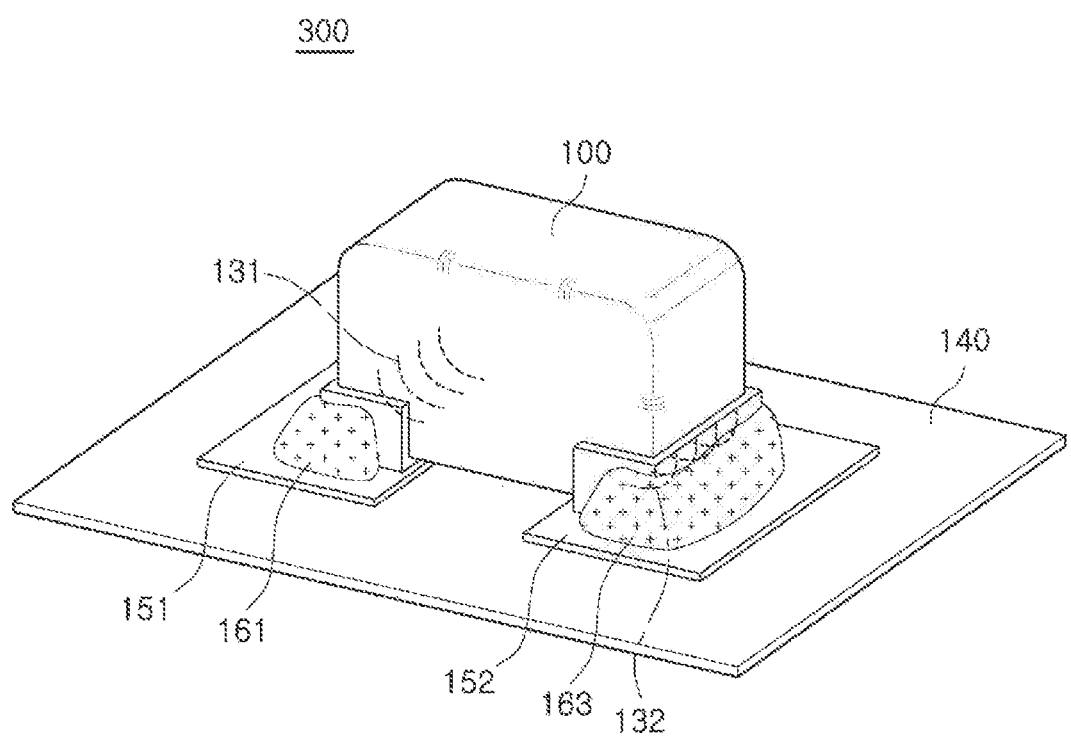
FIG. 10 is a perspective diagram illustrating a substrate on which a multilayer ceramic capacitor is mounted, according to an example embodiment of the present disclosure

The example embodiments may also relate to a substrate of an electronic component on which a multilayer ceramic capacitor is mounted. FIG. 10 is a perspective diagram illustrating a substrate on which a multilayer ceramic capacitor is mounted according to an example embodiment. Referring to FIG. 10, a substrate 300 on which the multilayer ceramic capacitor is mounted may include a printed circuit board 140 having two or more electrode pads 151 and 152, the multilayer ceramic capacitor 100 installed on the printed circuit board 140, and solders 161 and 163 connecting the electrode pads 151 and 152 to the multilayer ceramic capacitor 100. The multilayer ceramic capacitor 100 may be the multilayer ceramic capacitor 100 described in the aforementioned example embodiment, and the external electrodes 131 and 132 of the multilayer ceramic capacitor 100 may be connected to the electrode pads 151 and 152 by the solders 161 and 163.

In the example embodiment, an internal electrode of the multilayer ceramic capacitor 100 installed on the substrate 300 may be disposed in a direction perpendicular to the printed circuit board 140. In this case, the multilayer ceramic capacitor 100 may be a vertically mounted type. FIG. 10 illustrates an example of the substrate 140 on which the multilayer ceramic capacitor 100 including the internal electrode disposed in a direction perpendicular to the printed circuit board 140 is mounted. FIG. 10 illustrates the multilayer ceramic capacitor 100 in which two external electrodes are disposed, but a multilayer ceramic capacitor 200 in which four external electrodes are disposed may also be applied as described in the aforementioned example embodiment. The multilayer ceramic capacitor including four external electrodes may also be mounted horizontally, as well as being mounted vertically.

According to the aforementioned example embodiments, by increasing a contact area of the dielectric layer, the multilayer ceramic capacitor having improved mechanical strength may be provided.

Also, the multilayer ceramic capacitor having improved moisture resistance reliability may be provided.

Further, by improving connectivity between the internal electrode and the external electrode, an ESR defect may be prevented in the multilayer ceramic capacitor.

Additionally, the multilayer ceramic capacitor may have high capacitance, and cracks and delamination may be prevented in the multilayer ceramic capacitor.

While the example embodiments have been shown and described above, it will be apparent to those skilled in the art that modifications and variations could be made without departing from the scope of the present invention as defined by the appended claims.

What is claimed is:

1. A multilayer ceramic capacitor, comprising:
a body including a dielectric layer, and first and second internal electrodes layered in a third direction with the dielectric layer interposed therebetween and having first and second connection portions, respectively, the body including first and second surfaces opposing each other in the third direction, third and fourth surfaces opposing each other in a first direction, and fifth and sixth surfaces opposing each other in a second direction;
a first external electrode connected to the first internal electrode and disposed on the fifth surface of the body; and
a second external electrode connected to the second internal electrode, spaced apart from the first external electrode, and disposed on the fifth surface of the body,
wherein the first connection portion of the first internal electrode is connected to the first external electrode,
wherein the second connection portion of the second internal electrode is connected to the second external electrode,
wherein in a first direction-second direction cross-section, a substantially entire surface, being in contact with one of the first and second external electrodes, of one of the first and second connection portions has a rounded shape, and
wherein in the first direction-second direction cross-section, a radius of curvature of the surface, being in direct contact with the one of the first and second external electrodes, of the one of the first and second connection portions is within a range of 0.1 to 1 times a width, in the second direction, of the one of the first connection portion and the second connection portion.

2. The multilayer ceramic capacitor of claim 1, wherein a ratio, $\ell a/L1$, of a length, $\ell a$, of the one of the first connection portion and the second connection portion to a length, L1, of one of the first internal electrode and the second internal electrode connected to the one of the first connection portion and the second connection portion is within a range of 0.1 to 0.4.

3. The multilayer ceramic capacitor of claim 1, wherein a ratio, Wa/W1, of a width, Wa, of one of the first connection portion and the second connection portion to a width, W1, of one of the first internal electrode and the second internal electrode connected to the one of the first connection portion and the second connection portion, is within a range of 0.1 to 0.4.

4. A multilayer ceramic capacitor, comprising:
a body including a dielectric layer, and first and second internal electrodes layered in a third direction with the dielectric layer interposed therebetween and having first and second connection portions, respectively, the body including first and second surfaces opposing each other in the third direction, third and fourth surfaces opposing each other in a first direction, and fifth and sixth surfaces opposing each other in a second direction;
a first external electrode connected to the first internal electrode and disposed on the third surface and the fifth surface of the body; and
a second external electrode connected to the second internal electrode, spaced apart from the first external electrode, and disposed on the fourth surface and the fifth surface of the body,
wherein the first connection portion of the first internal electrode extends from the third surface and the fifth surface and is directly connected to the first external electrode on the third surface and the fifth surface,
wherein the second connection portion of the second internal electrode extends from the fourth surface and the fifth surface is directly connected to the second external electrode on the fourth surface and the fifth surface,
wherein the first internal electrode and the second internal electrode are electrically insulated from the sixth surface, and
wherein in a first direction second direction cross-section, a substantially entire surface, connected to the one of the first and second external electrodes, of the one of the first and second connection portions has a rounded shape.

5. The multilayer ceramic capacitor of claim 4, wherein each external electrode of the multilayer ceramic capacitor is spaced apart from the sixth surface.

6. The multilayer ceramic capacitor of claim 4, wherein in the first direction second direction cross-section, a radius of curvature of the surface, connected to the one of the first and second external electrodes, of the one of the first and second connection portions is within a range of 0.1 to 1 times a width, in the second direction, of the one of the first connection portion and the second connection portion.

7. A multilayer ceramic capacitor, comprising:
a body including a dielectric layer, and first and second internal electrodes layered in a third direction with the dielectric layer interposed therebetween, the body including first and second surfaces opposing each other in the third direction, third and fourth surfaces opposing each other in a first direction, and fifth and sixth surfaces opposing each other in a second direction, the first internal electrode including first and fourth connection portions and the second internal electrode including second and third connection portions;
a first external electrode connected to the first internal electrode and disposed on the third and fifth surfaces of the body;
a second external electrode connected to the second internal electrode, spaced apart from the first external electrode, and disposed on the fourth and fifth surfaces of the body;
a third external electrode connected to the second internal electrode, spaced apart from the first and second external electrodes, and disposed on the fourth and sixth surfaces of the body; and a fourth external electrode connected to the first internal electrode, spaced apart from the first to third external electrodes, and disposed on the third and sixth surfaces of the body, wherein the first connection portion of the first internal electrode extends from the third and fifth surfaces of the body and is in contact with the first external electrode on the third and fifth surfaces of the body, wherein the second connection portion of the second internal electrode extends from the fourth and fifth surfaces of the body and is in contact with the second external electrode on the fourth and fifth surfaces of the body, wherein the third connection portion of the second internal electrode extends from the fourth and sixth surfaces of the body and is in contact with the third external electrode on the fourth and sixth surfaces of the body, wherein the fourth connection portion of the first internal electrode extends from the third and sixth surfaces of the body and is in contact with the fourth external electrode on the third and sixth surfaces of the body, wherein in a first direction-second direction cross-section, a surface, being in contact with one of the first to fourth external electrodes, of one of the first to fourth connection portions has a rounded shape, and wherein in the first direction-second direction cross-section, a radius of curvature of the surface, being in direct contact with the one of the first to fourth external electrodes, of the one of the first to fourth connection portions is within a range of 0.1 to 1 times a width, in the second direction, of the one of the first to fourth connection portions.

* * * * *